United States Patent
Xia et al.

(10) Patent No.: US 11,025,206 B2
(45) Date of Patent: Jun. 1, 2021

(54) POWER SUPPLY FOR ENVELOPE TRACKING

(71) Applicant: SHAANXI REACTOR MICROELECTRONICS CO., LTD, Xi'an (CN)

(72) Inventors: Qin Xia, Xi'an (CN); Shihong Yang, Xi'an (CN)

( * ) Notice: Subject to any disclaimer, the term of this patent is extended or adjusted under 35 U.S.C. 154(b) by 0 days.

(21) Appl. No.: 16/274,244

(22) Filed: Feb. 13, 2019

(65) Prior Publication Data

US 2019/0190467 A1 Jun. 20, 2019

Related U.S. Application Data

(63) Continuation of application No. PCT/CN2018/078698, filed on Mar. 12, 2018.

(30) Foreign Application Priority Data

Sep. 7, 2017 (CN) .......................... 201710589856.0

(51) Int. Cl.
*H03F 3/19* (2006.01)
*H03F 3/217* (2006.01)
*H03F 1/02* (2006.01)
*H03F 3/24* (2006.01)

(52) U.S. Cl.
CPC ................. *H03F 3/19* (2013.01); *H03F 1/02* (2013.01); *H03F 1/0222* (2013.01); *H03F 3/217* (2013.01); *H03F 3/245* (2013.01); *H03F 2200/102* (2013.01); *H03F 2200/432* (2013.01); *H03F 2200/451* (2013.01)

(58) Field of Classification Search
CPC .......... H03F 3/19; H03F 3/245; H03F 1/0222; H03F 3/217; H03F 1/02; H03F 2200/432; H03F 2200/451; H03F 2200/102; H03F 1/0211; H03F 3/189; H03F 3/211
USPC ................................. 330/127, 297, 129, 279
See application file for complete search history.

(56) References Cited

U.S. PATENT DOCUMENTS 9,722,543 B2 * 8/2017 Wilson .................. H03F 1/0227
9,806,919 B2 * 10/2017 Midya .................. H04L 25/061

* cited by examiner

*Primary Examiner* — Hieu P Nguyen
(74) *Attorney, Agent, or Firm* — W&K IP

(57) ABSTRACT

Provided is a power supply for envelope tracking, comprising: a first driving unit for finally providing a first current based on a preset and variably-set first high-frequency threshold or threshold interval; a second driving unit for finally providing a second current based on a preset and variably-set second low-frequency threshold or threshold interval; a third driving unit for providing a third current based on a delayed signal; and a superimposing unit for superimposing the first current, the second current, and the third current to provide a supply voltage of a radio-frequency power amplifier. A new power supply for envelope tracking is provided, which is capable of more efficiently providing a supply voltage of the radio frequency power amplifier by superimposing a first current to a third current.

10 Claims, 5 Drawing Sheets

POWER SUPPLY FOR ENVELOPE TRACKING

CROSS REFERENCE TO RELATED APPLICATIONS

This application is a continuation of International Patent Application No. PCT/CN2018/078698 with a filing date of Mar. 12, 2018, designating the United States, now pending, and further claims priority to Chinese Patent Application No. 201710589856.0 filed on Sep. 7, 2017, the entire content of which is incorporated herein by reference.

TECHNICAL FIELD

The present disclosure relates to the field of mobile communication, and in particular to a power supply for envelope tracking.

BACKGROUND

In the field of mobile communication, a power supply having an envelope-tracking capability is supposed to be used to improve an efficiency of a radio-frequency power amplifier.

Envelope tracking is supposed to dynamically change a supply voltage of the radio-frequency power amplifier along with output power transmitted by the radio-frequency power amplifier. The envelope tracking is also supposed to dynamically adjust the supply voltage of the power amplifier to track an amplitude of a radio-frequency input signal envelope.

When the signal envelope becomes larger, the supply voltage is increased; when the signal envelope becomes smaller, the supply voltage is reduced. In this way, the radio-frequency power amplifier can approach its optimal efficiency point in the most of an operation range, thereby improving energy utilization of a mobile communication device.

How to further improve an efficiency of a power supply for envelope tracking is always a technical problem to be considered in the art.

SUMMARY

Figure 1:
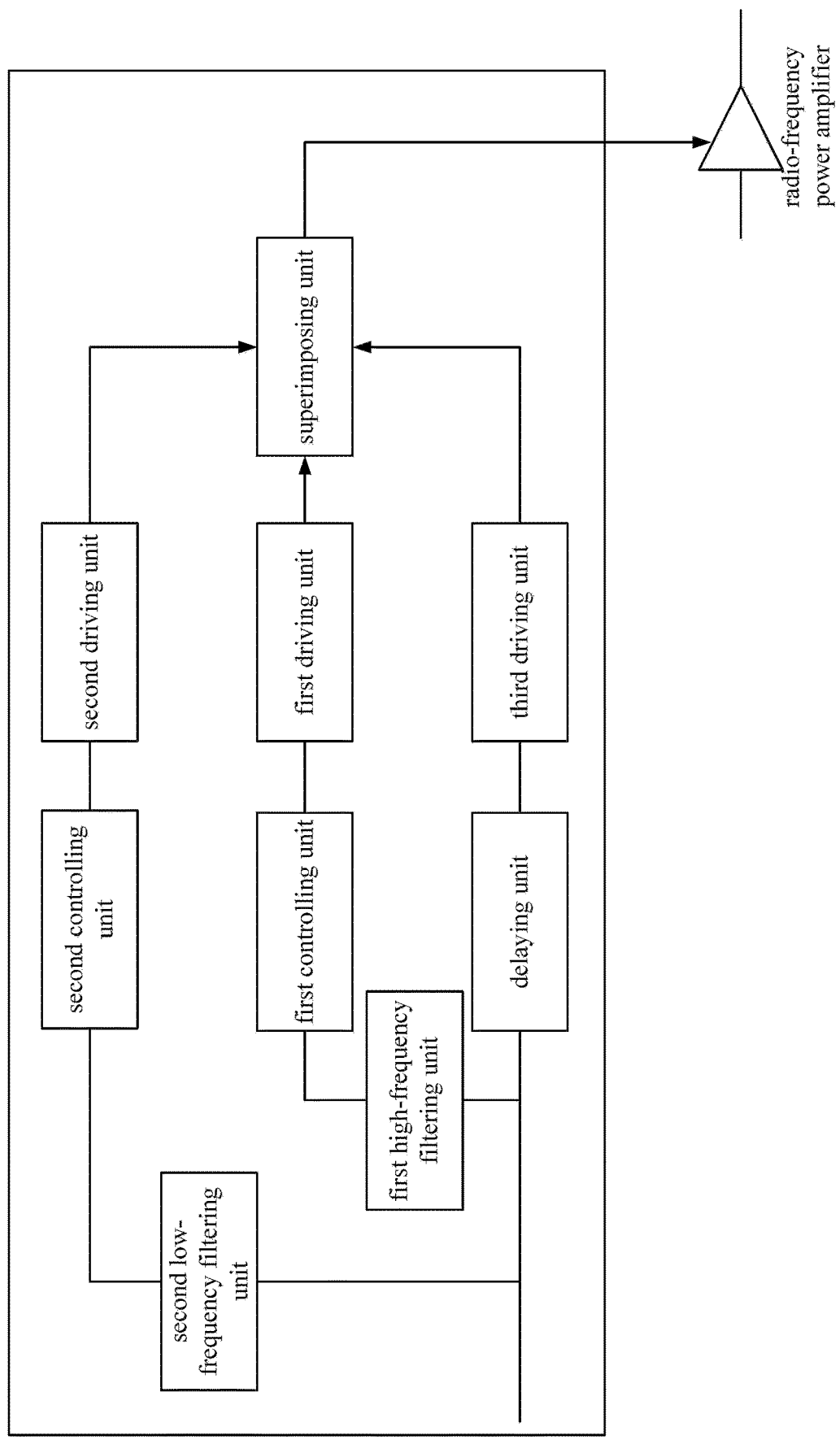
FIG. 1 is a schematic diagram illustrating a structure of a power supply according to an example of the present disclosure.

To solve the above technical problem, the present disclosure provides a power supply for envelope tracking, including:

a first high-frequency filtering unit, configured to perform filtering processing for a first envelope signal and output a first filtered signal according to a preset and variably-set first high-frequency threshold or threshold interval;

a first controlling unit, configured to generate a first control signal in response to the first filtered signal;

a first driving unit, configured to provide a first current based on the first control signal;

a second low-frequency filtering unit, configured to perform filtering processing for the first envelope signal and output a second filtered signal according to a preset and variably set second low-frequency threshold or threshold interval;

a second controlling unit, configured to generate a second control signal in response to the second filtered signal;

a second driving unit, configured to provide a second current based on the second control signal;

a delaying unit, configured to perform delaying processing for the first envelope signal and output a delayed signal;

a third driving unit, configured to provide a third current based on the delayed signal; and a superimposing unit, configured to superimpose the first current, the second current, and the third current to provide a supply voltage of a radio-frequency power amplifier.

Preferably, the filtering unit includes any one or any combination of a low-pass filter, a band-pass filter, and a high-pass filter.

Preferably, the first controlling unit and the second controlling unit include any one of a pulse width modulator and a pulse density modulator.

Preferably, the first driving unit includes a GaN switching amplifier or a Si-based switching amplifier.

Preferably, the third driving unit includes a linear amplifier.

Preferably, the delaying unit includes any of an analog or digital type delay circuit or buffer circuit.

Preferably, an envelope signal input to the radio-frequency power amplifier is used as the first envelope signal.

Preferably, the power supply also includes:

a fourth frequency filtering unit, configured to perform filtering processing for the first envelope signal and output a fourth filtered signal according to a preset and variably-set fourth frequency threshold or threshold interval;

a fourth controlling unit, configured to generate a fourth control signal in response to the fourth filtered signal; and a fourth driving unit, configured to provide a fourth current based on the fourth control signal, where the fourth current is superimposed to the superimposing unit together with the first current to the third current to provide the supply voltage of the radio-frequency power amplifier.

Preferably, the first driving unit and the second driving unit both include an inductor.

Preferably, the first high-frequency threshold or threshold interval is adapted to an LTE/LTE-A/OFDM signal, and the fourth frequency threshold or threshold interval is also supposed to be adapted to a WCDMA signal.

By adopting the above technical solutions, the present disclosure implements a new power supply for envelope tracking, which can provide the supply voltage to the radio-frequency power amplifier more efficiently by superimposing at least the first current to the third current.

DETAILED DESCRIPTION

Many details are described in the following descriptions to provide more comprehensive descriptions to examples of the present disclosure. However, it is apparent to those skilled in the art that the examples of the present disclosure are supposed to be implemented without these details. In other examples, well-known structures and devices are illustrated by block diagrams rather than in detail so as not to obscure the examples of the present disclosure. In addition, characteristics of different examples described below are supposed to be combined with each other unless otherwise stated.

As shown in FIG. 1, the present disclosure provides a power supply for envelope tracking, including:

a first high-frequency filtering unit, configured to perform filtering processing for a first envelope signal and output a first filtered signal according to a preset and variably-set first high-frequency threshold or threshold interval;

a first controlling unit, configured to generate a first control signal in response to the first filtered signal;

a first driving unit, configured to provide a first current based on the first control signal;

a second low-frequency filtering unit, configured to perform filtering processing for the first envelope signal and output a second filtered signal according to a preset and variably set second low-frequency threshold or threshold interval;

a second controlling unit, configured to generate a second control signal in response to the second filtered signal;

a second driving unit, configured to provide a second current based on the second control signal;

a delaying unit, configured to perform delaying processing for the first envelope signal and output a delayed signal;

a third driving unit, configured to provide a third current based on the delayed signal; and a superimposing unit, configured to superimpose the first current, the second current, and the third current to provide a supply voltage of a radio-frequency power amplifier.

Providing the supply voltage of the radio-frequency power amplifier by superimposing the first current, the second current and the third current in the example is totally different from providing the supply voltage of the radio-frequency power amplifier by simply connecting two currents in parallel in the prior art and the fundamental difference is as follows: in this example, the filtered signals are obtained according to the first high-frequency threshold or threshold interval and the second low-frequency threshold or threshold interval and the control signals are further obtained, where these two thresholds or threshold intervals are preset and variably set. Since one of these two thresholds or threshold intervals is used for high frequency and the other is used for low frequency, these two thresholds or threshold intervals are different or not overlapped. However, such a power supply for envelope tracking does not exist in the prior art. In the prior art, filtering is performed directly by a filter rather than based on the preset and variably-set threshold or threshold interval.

In the example, the most prominent technical effect is as follows: since the thresholds or threshold intervals are preset and variably set and are different or not overlapped, it indicates that the example can be applied to the 5th-generation mobile communication technology, and the 6th-generation mobile communication technology and even a newer technology in the future, without being limited to the 4th-generation mobile communication technology represented by LTE or the 3rd-generation mobile communication technology represented by WCDMA.

The example also has other features as follows: the first current, the second current, and the third current are all related to the first envelope signal, therefore, a power supply for envelop tracking can be realized in the above example.

It can be understood that the above first current, the second current, and the third current are generated based on the first control signal, the second control signal, and the delayed signal on the precondition of existence of the first envelope signal.

Since the envelope signal corresponds to radio-frequency signals of different frequencies, the above example is supposed to include a plurality of filtering units so that a plurality of filtered signals are obtained after the first envelope signal is filtered and the first current and the second current are provided by a plurality of driving units. In addition, the filtering unit has a time constant, resulting in that the first current and the second current have a delay effect for the first envelope signal. Therefore, the above delaying unit also performs delaying processing and further the third current is provided through the third driving unit. It may be seen that the third current also has a delay effect for the first envelope signal. In fact, no ideal device or unit without delay effect exists.

The matching problem of the delay effect belongs to common knowledge of the circuit field, and the present disclosure does not focus on how to design and adjust the time constant of a delay circuit, which will not be described herein.

By summarizing the above two technical effects, it is shown that the example considers both the high frequency and the low frequency, which can be not only downward compatible well but also oriented to the future, thereby satisfying the requirement of the future mobile communication technology for the power supply of the radio-frequency power amplifier.

It is to be noted that if the power supply in the above example is an analog power supply, the superimposing unit is implemented by connecting the circuits corresponding to the first current to the third current respectively in parallel. If the power supply in the above example is a digital power supply, digital circuits all are supposed to implement the superimposing unit, as long as digital signals representing the first current to the third current can be superimposed by any digital circuit.

Figure 2:
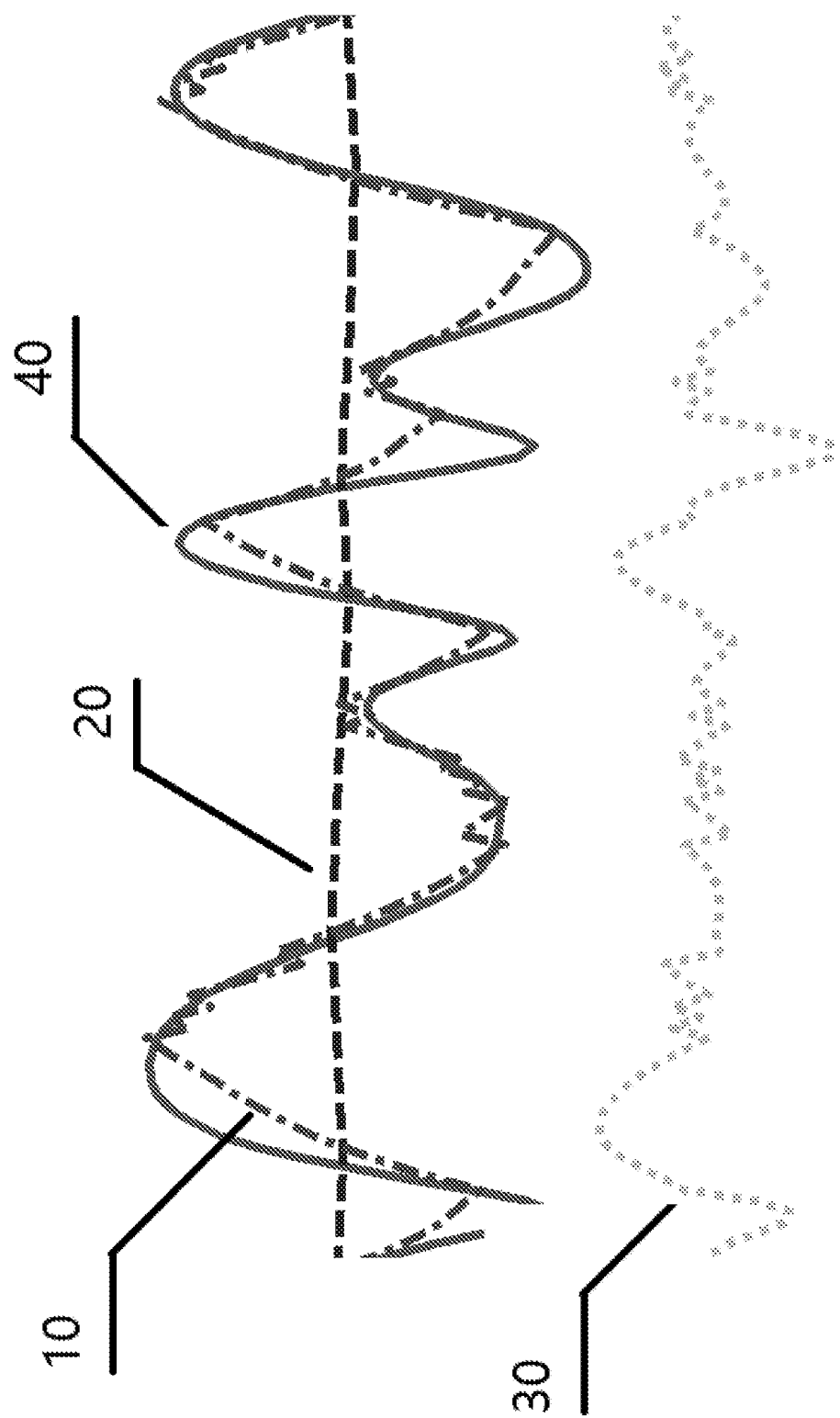
FIG. 2 is a schematic diagram illustrating an envelope in a time domain according to an example of the present disclosure.

In another example, as shown in FIG. 2, a red spaced dotted-dashed line 10 indicates a voltage converted by the first current of the first driving unit, a blue dashed line 20 indicates a voltage converted by the second current of the second driving unit, a green dotted-dashed line 30 indicates a voltage converted by the third current of the third driving unit, and a magenta solid line 40 indicates all envelope voltages converted after the first current to the third current are superimposed.

Figure 3:
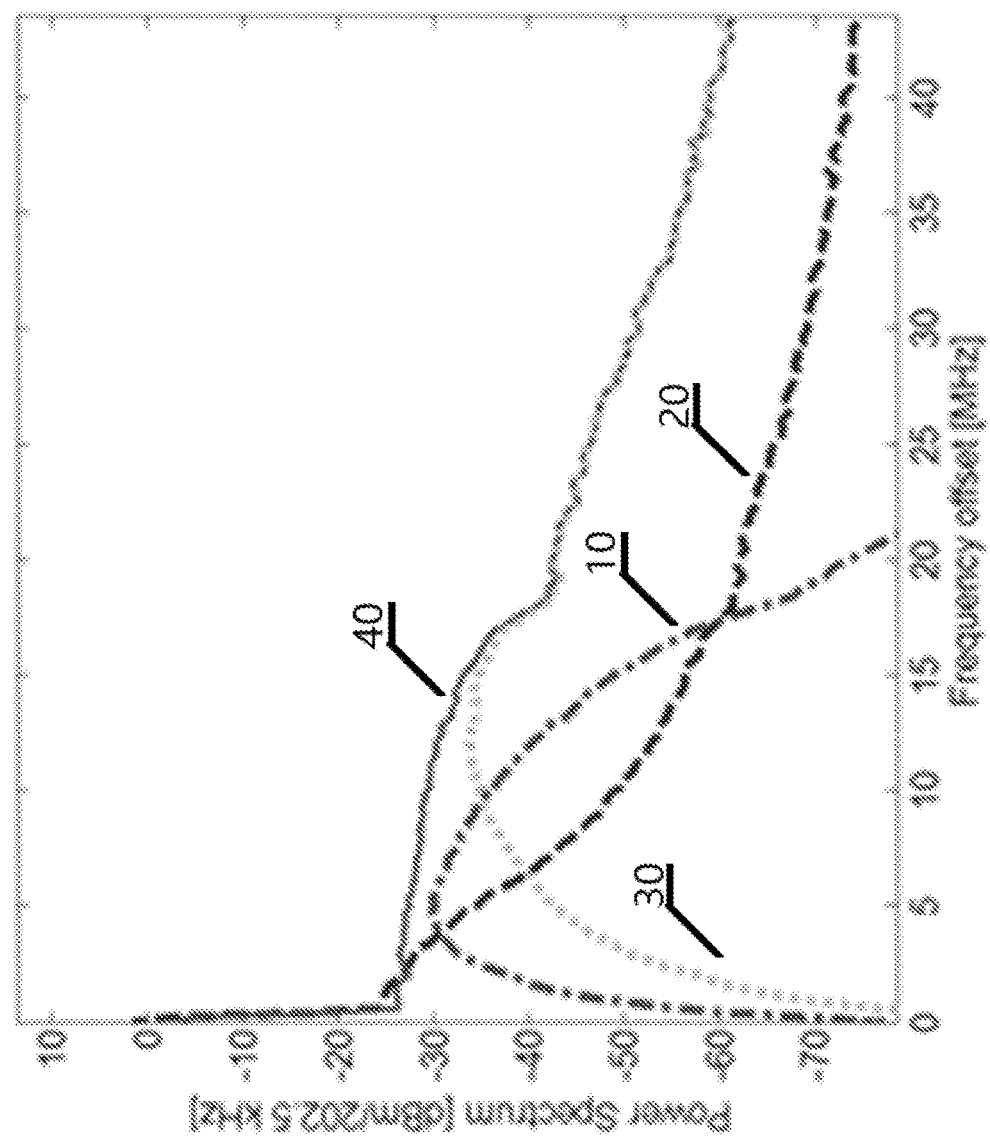
FIG. 3 is a schematic diagram illustrating an envelope in a frequency domain according to an example of the present disclosure.

Further, FIG. 3 illustrates a representation of a time domain signal of FIG. 2 in a frequency domain.

Figure 4:
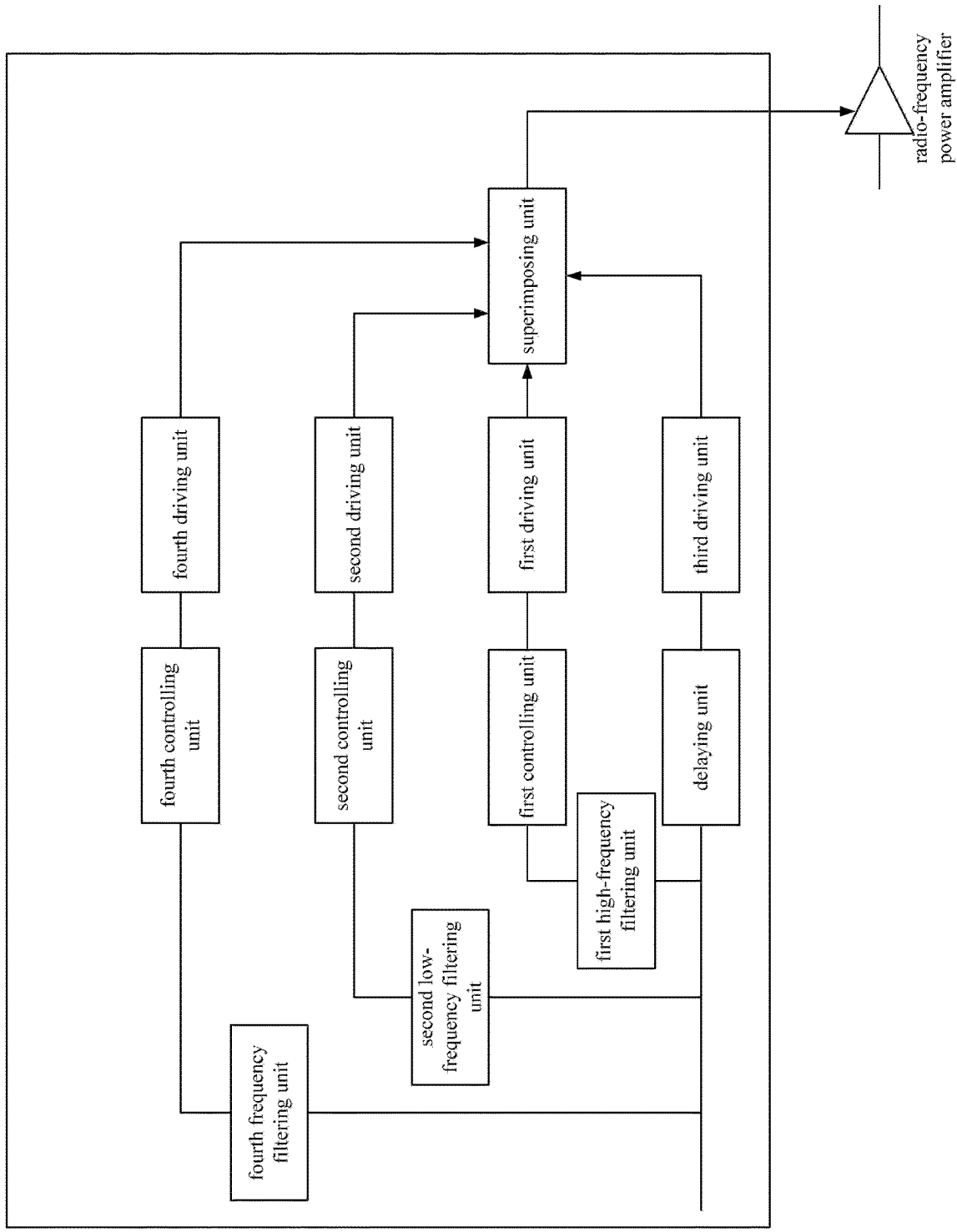
FIG. 4 is a schematic diagram illustrating a structure of a power supply according to another example of the present disclosure.

In another example, as shown in FIG. 4, the power supply is supposed to also include:

a fourth frequency filtering unit, configured to perform filtering processing for the first envelope signal and output a fourth filtered signal according to a preset and variably-set fourth frequency threshold or threshold interval;

a fourth controlling unit, configured to generate a fourth control signal in response to the fourth filtered signal; and a fourth driving unit, configured to provide a fourth current based on the fourth control signal, where the fourth current is superimposed to the superimposing unit together with the first current to the third current to provide the supply voltage of the radio-frequency power amplifier.

There is an inheritance relationship between the example and the previous example and thus the fourth current is supposed to be added similarly. Due to the existence of the fourth frequency threshold or threshold interval, this example can be applied more widely than the previous example. Theoretically, based on the previous example and this example, a fifth-current-related unit, a sixth-current-related unit and the like is supposed to be continuously added in other examples of the present disclosure.

In another example, the delaying unit includes any type of delay circuit or buffer circuit.

It is to be noted that since the first driving unit is controlled by the first control signal, in combination with the present technical situation and development in the art, the first controlling unit and the second controlling unit are supposed to preferably include any one of a pulse width modulator and a pulse density modulator in another example. However, each controlling unit is not limited herein.

Similarly, in another example, the first driving unit and the second driving unit include a switching amplifier. In this way, the pulse width modulator or the pulse density modulator, or a combination thereof is supposed to cooperate with one or more switching amplifiers to provide the first current or the second current, thereby constituting a plurality of examples in the present disclosure.

In another example, considering that the signal frequency in the mobile communication technology is higher and higher, the first driving unit is supposed to include a GaN switching amplifier because the GaN switching amplifier can reach a very high level in switching frequency. Similarly, a Si-based switching amplifier with a very high switching frequency (i.e., a silicon-based switching amplifier) is supposed to also be adopted.

In another example, the third driving unit includes a linear amplifier. In combination with the foregoing description, it can be easily found that in the examples of the present disclosure, a combination of the switching amplifier and the linear amplifier is a better choice to fully exert the superimposing function of the first current to the third current. However, the first and the second driving units are not limited herein, as long as they are applicable to the envelope tracking.

In addition to the foregoing frequency and delay, when the above switching amplifier or the linear amplifier is adopted, amplitude adjustment of the envelope signal is also supposed to be involved in the envelope tracking. Many contents relating to different amplitude adjustments performed by using different amplifiers are already disclosed in the prior art, and the present disclosure does not aim to provide a new method of adjusting an amplitude, and therefore, relevant descriptions are not repeated herein.

In another example, the filtering unit includes any one or any combination of a low-pass filter, a band-pass filter, and a high-pass filter.

It may be seen that the example relates to a type selection of the filtering unit. As shown in an envelope diagram of FIG. 2, since an envelope signal corresponds to radio-frequency signals of different frequencies, the low-pass filter, the band-pass filter and the high-pass filter are supposed to be correspondingly selected for different frequencies.

For example, if the low-pass filter is adopted, the envelope signal corresponding to a first frequency interval can pass through a filter and can be used to obtain one filtered signal and further provide a particular current through a particular driving unit. If the band-pass filter is adopted, the envelope signal corresponding to a second frequency interval can pass through the filter and can be used to obtain one filtered signal and further provide a particular current through a particular driving unit. If the high-pass filter is adopted, the envelope signal corresponding to a third frequency interval can pass through the filter and can be used to obtain one filtered signal and further provide a particular current through a particular driving unit. For the low-pass filter, the band-pass filter, and the high-pass filter, namely, from the perspective of a value of the frequency threshold or the threshold interval, the first frequency interval is usually lower than the second frequency interval, and the second frequency interval is usually lower than the third frequency interval.

In the present disclosure, it is very meaningful to adopt a combination of a low-pass filter, a band-pass filter and a high-pass filter. For example, when a single adopted filter cannot well exert the function of each or a particular filtering unit and cannot be well applied to an envelope signal with a wide frequency interval, and thus cannot well exert the function of the power supply for envelop tracking described in the present disclosure, the filtering unit is supposed to be of a combination type. For example, the filtering unit is also supposed to include a band-pass filter and/or a high-pass filter in addition to a low-pass filter, thereby performing envelope tracking more accurately. It is easily understood that with such combination, a corresponding driving unit is also preferably provided with a driving circuit corresponding to each filter, such as each corresponding switching amplifier.

In another example, the first envelope signal is an envelope signal input to the radio-frequency power amplifier.

In the example, when the first envelope signal is an envelope signal input to the radio-frequency power amplifier, envelope tracking is implemented by inputting the envelope signal from a signal source, into the radio-frequency power amplifier, as a radiofrequency (i.e., RF) input signal is taken as a reference signal for envelope tracking in most technical solutions of the prior art.

In addition, feedback control or feedforward control is not excluded in the examples of the present disclosure. It is required to consider the feedback control or the feedforward control or a combination thereof according to the actual circumstance. According to a control theory, in the case of adopting the feedback control, a better control capability is supposed to be obtained for some systems in combination with the feedforward control.

Further, in the case of satisfying a basic requirement of an efficiency of the radio frequency power amplifier, the feedback control and/or the feedforward control is supposed to be further combined based on the examples already disclosed in the present disclosure to perform better control for error and delay, including but not limited to performing error and delay compensation for the envelope.

As shown in FIG. 2, the envelope signal usually relates to different amplitudes and different frequencies, and the type selection of the filtering unit is fully described in the related examples described above. Whether or how the filtering unit operates is supposed to be controlled by the amplitude of the envelope signal, such as the thresholds or threshold intervals described in the above examples.

In another example, the first high-frequency threshold or threshold interval is adapted to an LTE/LTE-A/OFDM signal, and the fourth frequency threshold or threshold interval is adapted to a WCDMA signal. As described above, the technology of the present disclosure can be not only downward compatible but also oriented to the future, and therefore, the technology can be better compatible with WCDMA better while well adapting to the LTE.

As shown in FIG. 4, based on the principle disclosed in the present disclosure as described above, the structure of the above driving units and controlling units is supposed to be further expanded to the fourth driving unit, the fourth controlling unit and the fourth frequency filtering unit. In view of the first high-frequency filtering unit and the second low-frequency filtering unit described above, the fourth frequency filtering unit is supposed to correspond to a medium frequency, and the fourth driving unit is supposed to include a medium-speed switching amplifier.

Further, in another example, the structure is supposed to also be expanded to a fifth driving unit, a corresponding fifth controlling unit and a corresponding fifth frequency filtering unit (this example will not be repeatedly illustrated in view of FIG. 1, FIG. 4, and the principle of the present disclosure disclosed in the foregoing examples). The first driving unit is supposed to include a GaN or another high-speed or ultrahigh-speed switching amplifier, the second driving unit is supposed to include a fast-speed switching amplifier, the fourth driving unit is supposed to include a medium-speed switching amplifier, and the fifth driving unit is supposed to include a slow-speed switching amplifier. Correspondingly, different switching amplifiers are controlled by control signals sent from different control units. It is to be noted that the ultrahigh speed, the fast speed, the medium speed and the slow speed herein mutually constitute a relative concept and therefore the speeds have clear meanings herein. In addition, the high frequency, the low frequency, and the medium frequency described above also mutually constitute a relative concept. These relative concepts all conform to conventional knowledge in the field of mobile communication technology, and are all clear concepts.

Figure 5:
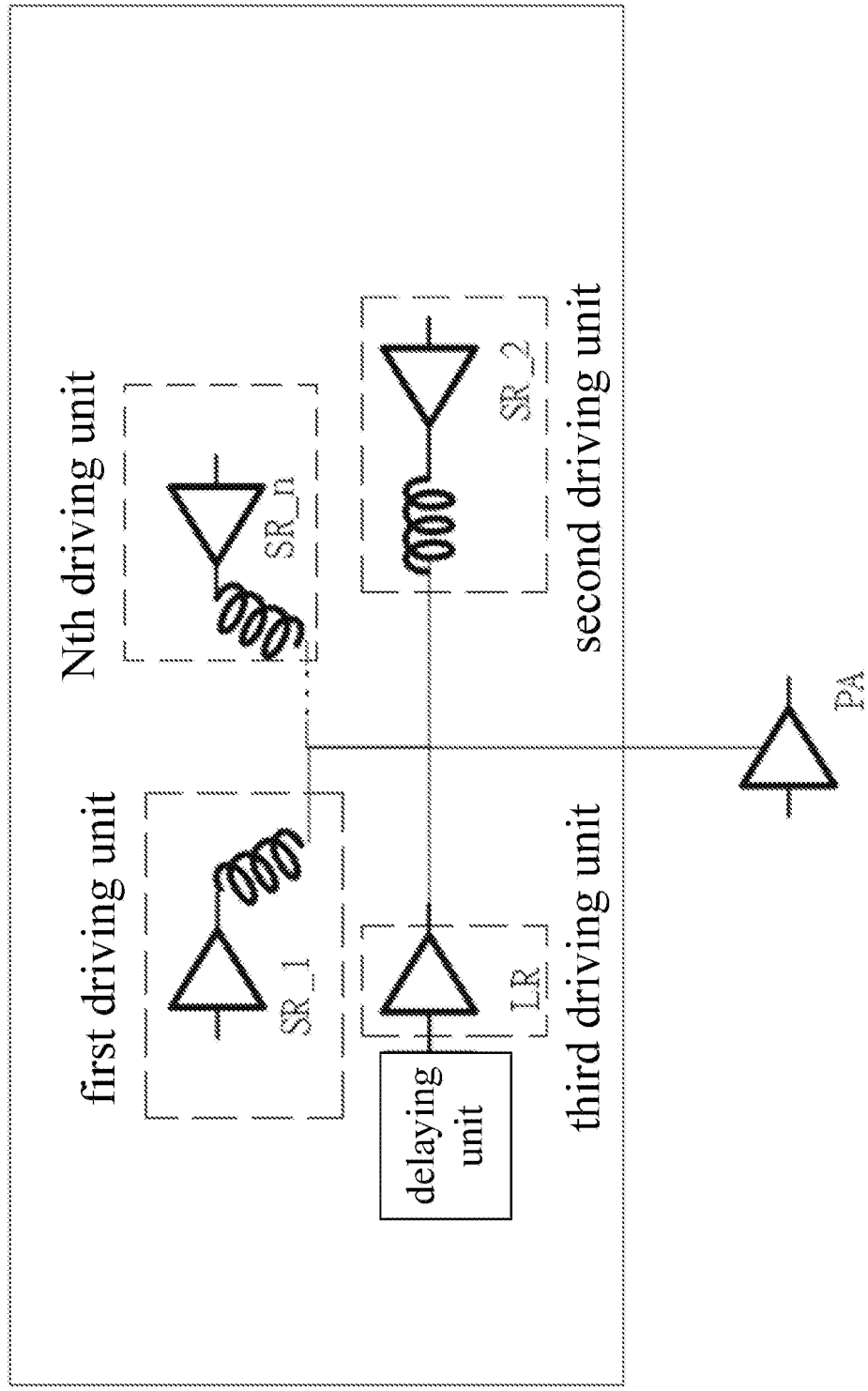
FIG. 5 is a schematic diagram illustrating a structure of a power supply according to yet another example of the present disclosure.

In another example, the first driving unit and the second driving unit both include a corresponding amplifier and an inductor, are connected in parallel, and are further connected in parallel with the third driving unit. As shown in FIG. 5, the first driving unit is shown on the upper left corner, a switching amplifier SR_1 in the first driving unit is a GaN switching amplifier, and the first current generated by the switching amplifier corresponds to a high-frequency current which corresponds to the first high-frequency filtering unit described in the previous example. Further, the first current stores and releases energy via an inductor. In addition, the switching amplifier in the second driving unit in FIG. 5 is a slow-speed switching amplifier which is supposed to correspond to the second low-frequency filtering unit described above. The second current also stores and releases energy via an inductor. In addition, the third driving unit in FIG. 5 includes a linear amplifier LR (note: SR is an English abbreviation of a switching amplifier, and LR is an English abbreviation of a linear amplifier).

As described above, relevant examples of the present disclosure is supposed to expand to other switching units to realize superimposition of more currents as described above in addition to that branch circuits relating to the first driving unit and the second driving unit include respective inductors, for example, the example is supposed to be expanded to an n-th driving unit and even more or an unlimited number of driving units connected in parallel in FIG. 5. The n-th driving unit and even the more or the unlimited number of driving units is supposed to all adopt switching amplifiers being SR_2, . . . , SR_n respectively, and these switching amplifiers is supposed to all be GaN switching amplifiers. Similarly, the corresponding current also stores and releases energy via the inductor of each branch circuit respectively.

Obviously, in the example shown in FIG. 5, the first current generated by the first driving unit, the second current generated by the second driving unit, the third current generated by the third driving unit, and an n-th current generated by the n-th driving unit and even more and an unlimited number of other driving units is supposed to be superimposed by connecting different branch circuits in parallel in this example, thereby providing a supply voltage to a radio-frequency power amplifier PA.

More critically, except for the third current generated by the third driving unit, other currents are all controlled by respective control units, and the signal of the controlling unit is based on the corresponding filtering unit (note: FIG. 5 does not illustrate each control unit and a corresponding filtering unit).

As described above, each filtering unit generates a corresponding filtered signal according to a preset and variably-set threshold or threshold interval and the filtered signal is supposed to be further used for generating a corresponding control signal. In this example, different thresholds or threshold intervals cover a wide range of high, medium and low frequencies, and are different from or not overlapped with each other. As described above, filtering is performed directly by a filter rather than based on a preset or variably-set threshold or threshold interval in the prior art, and thus no similar power supply for envelop tracking disclosed in the present disclosure exists.

Since thresholds or threshold intervals are preset and variably-set and are different from or not overlapped with each other, when these thresholds or threshold intervals cover a sufficiently wide frequency range, it indicates that the example is supposed to be applied to the 5th generation mobile communication technology, the 6th generation mobile communication technology, and even a newer technology in the future without being limited to the 4th generation mobile communication technology represented by LTE or the 3rd generation mobile communication technology represented by WCDMA.

In some examples, the controlling unit is supposed to be provided on a chip or processor (e.g., silicon) of a digital transmitter. Further, the driving unit is also supposed to be provided on the chip or processor of the digital transmitter. Similarly, the remaining units are also supposed to be provided on relevant chips or processors. Naturally, the above power supply is supposed to also be provided on a chip or a processor of the digital transmitter.

The examples of the present disclosure are supposed to be implemented by a hardware or software according to a specific implementation requirement. The implementation is supposed to be performed by using a digital storage medium (e.g., a floppy disk, DVD, Blu-ray, CD, ROM, PROM, EPROM, EEPROM or a flash memory) storing electronic readable control signals. Therefore, the digital storage medium is supposed to be computer readable.

In some examples, part or all functions of the method described herein is supposed to be performed by using a programmable logic device (e.g., a Field Programmable Gate Array). In some examples, the Field Programmable Gate Array is supposed to cooperate with a microprocessor to implement the power supply described herein.

The above examples are merely illustrative of the principle of the present disclosure. It is to be understood that modifications and variations of arrangements and details described herein are apparent to those skilled in the art. Therefore, it is intended that the present disclosure is merely limited by the following scope of claims rather than specific details provided in the description and explanation of the examples herein.

We claim:

1. A power supply for envelope tracking, comprising:
a first high-frequency filtering unit, configured to perform filtering processing for a first envelope signal and output a first filtered signal according to a preset and variably-set first high-frequency threshold or threshold interval;
a first controlling unit, configured to generate a first control signal in response to the first filtered signal;
a first driving unit, configured to provide a first current based on the first control signal;
a second low-frequency filtering unit, configured to perform filtering processing for the first envelope signal and output a second filtered signal according to a preset and variably-set second low-frequency threshold or threshold interval;
a second controlling unit, configured to generate a second control signal in response to the second filtered signal;
a second driving unit, configured to provide a second current based on the second control signal;
a delaying unit, configured to perform delaying processing for the first envelope signal and output a delayed signal;
a third driving unit, configured to provide a third current based on the delayed signal; and
a superimposing unit, configured to superimpose the first current, the second current, and the third current to provide a supply voltage of a radio-frequency power amplifier
wherein, the preset and variably-set first high-frequency threshold t or threshold interval and preset and variably-set second low-frequency threshold or threshold interval are different or not overlapped.

2. The power supply of claim 1, wherein the filtering unit preferably comprises any one or any combination of a low-pass filter, a band-pass filter, and a high-pass filter.

3. The power supply of claim 1, wherein the first controlling unit and the second controlling unit comprise any one of a pulse width modulator and a pulse density modulator.

4. The power supply of claim 1, wherein the first driving unit and the second driving unit both comprise a GaN switching amplifier or a Si-based switching amplifier.

5. The power supply of claim 1, wherein the third driving unit comprises a linear amplifier.

6. The power supply of claim 1, wherein the delaying unit comprises any of an analog or digital type delay circuit or buffer circuit.

7. The power supply of claim 1, wherein the first envelope signal is an envelope signal input to the radio-frequency power amplifier.

8. The power supply of claim 1, further comprising:
a fourth frequency filtering unit, configured to perform filtering processing for the first envelope signal and output a fourth filtered signal according to a preset and variably-set fourth frequency threshold or threshold interval;
a fourth controlling unit, configured to generate a fourth control signal in response to the fourth filtered signal; and
a fourth driving unit, configured to provide a fourth current based on the fourth control signal, wherein the fourth current is superimposed to the superimposing unit together with the first current to the third current to provide the supply voltage of the radio frequency power amplifier.

9. The power supply of claim 1, wherein the first driving unit and the second driving unit both comprise an inductor.

10. The power supply of claim 8, wherein the first high-frequency threshold or threshold interval is adapted to an LTE or LTE_A or OFDM signal, and the fourth frequency threshold or threshold interval is also adapted to a WCDMA signal.

* * * * *